(12) United States Patent
Ren et al.

(10) Patent No.: US 9,929,285 B2
(45) Date of Patent: Mar. 27, 2018

(54) SUPER-JUNCTION SCHOTTKY DIODE

(71) Applicant: University of Electronic Science and Technology of China, Chengdu (CN)

(72) Inventors: Min Ren, Chengdu (CN); Yuci Lin, Chengdu (CN); Huiping Bao, Chengdu (CN); Lei Luo, Chengdu (CN); Zehong Li, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 15/602,107

(22) Filed: May 23, 2017

(65) Prior Publication Data

US 2018/0026143 A1 Jan. 25, 2018

(30) Foreign Application Priority Data

Jul. 25, 2016 (CN) .......................... 2016 1 0596069

(51) Int. Cl.
| H01L 29/76 | (2006.01) |
| H01L 29/872 | (2006.01) |
| H01L 29/15 | (2006.01) |
| H01L 29/66 | (2006.01) |

(52) U.S. Cl.
CPC .......... *H01L 29/872* (2013.01); *H01L 29/157* (2013.01); *H01L 29/158* (2013.01); *H01L 29/66143* (2013.01)

(58) Field of Classification Search
CPC ................ H01L 29/157; H01L 29/158; H01L 29/66143
See application file for complete search history.

(56) References Cited

U.S. PATENT DOCUMENTS

| 2009/0315107 | A1* | 12/2009 | Hsieh | ................ H01L 29/66143 257/334 |
| 2012/0098082 | A1* | 4/2012 | Hsu | ....................... H01L 29/872 257/471 |

FOREIGN PATENT DOCUMENTS

CN         103378170 A    10/2013

* cited by examiner

*Primary Examiner* — Samuel Gebremariam
(74) *Attorney, Agent, or Firm* — Gokalp Bayramoglu

(57) ABSTRACT

The present invention relates to the field of semiconductor technology, particularly to a super-junction schottky diode. According to the present invention, the effective area of schottky junction is increased by forming the schottky junction in the trench located in the body of the device. Therefore, the current capacity of this novel schottky diode can be greatly improved. In addition, a super-junction structure is used to improve the device's reverse breakdown voltage and reduce the reverse leakage current. The super-junction schottky diode provided in the present invention can achieve a larger forward current, a lower on-resistance and a better reverse breakdown characteristic.

4 Claims, 6 Drawing Sheets

SUPER-JUNCTION SCHOTTKY DIODE

CROSS REFERENCE

The present application is based on, and claims priority from, Chinese application number 201610596069.4, filed on Jul. 25, 2016, the disclosure of which is hereby incorporated by reference herein in its entirety.

TECHNICAL FIELD OF THE INVENTION

The present invention relates to the technical field of semiconductor devices, particularly to a super-junction schottky diode.

BACKGROUND OF THE INVENTION

Diodes are one of the most commonly used electronic devices. The types of traditional diodes are schottky diodes and PN junction diodes. PN junction diodes can withstand high reverse blocking voltage and has better stability. However, PN junction diodes have a larger forward voltage and a longer reverse recovery time. Schottky diodes are based on the principle of metal-semiconductor junction. Schottky diodes have a lower forward voltage and a faster reverse recovery since it has no minority carrier accumulation during the forward conduction. However, schottky diodes have a larger reverse leakage current and a poor temperature characteristic. There is a tradeoff between schottky diode's breakdown voltage and the forward voltage, which is called the "silicon limit". In order to improve the breakdown voltage of a schottky diode, the thickness of drift region must be enhanced and the doping concentration of drift region must be reduced, which leads to an increase of forward conduction loss. Therefore, the main application field of schottky diode is for low or middle voltage applications.

In order to improve the schottky diode's breakdown voltage without increasing its forward voltage, the super-junction structure is introduced into the schottky diode's drift region. For example, Chinese patent application "A super-junction schottky semiconductor device and its preparation method" (application number: 201210141949.4) provided a schottky diode based on the charge balance principle. However, the schottky junctions existing in schottky diodes are located on the surface of the devices, so that the current capacity of the schottky diode is limited since the surface area is limited.

SUMMARY OF THE INVENTION

The present invention provides a novel super-junction schottky diode. The effective area of the schottky junction is increased by forming the schottky junction at the trench located in the body of the device. Therefore, the current capacity of the novel schottky diode can be greatly improved. In addition, a super-junction structure is used to improve the device's reverse breakdown voltage and reduce the device's reverse leakage current.

According to an aspect of the invention, there is provided a super-junction schottky diode including: a metallized cathode electrode 1, a N+ substrate 2 (i.e., a heavily doped substrate of a conductivity type N), an N-type drift region 3 (i.e., a drift region of a conductivity type N), and a metalized anode electrode 9. Said N-type drift region 3 includes a P-type buried layer 4 (i.e., a buried layer of a conductivity type P), a P-type column 5 (i.e., a column of a conductivity type P), a P+ heavily doped region 6 (i.e., a heavily doped region of a conductivity type P), a N-type lightly doped region 8 (i.e., a lightly doped region of conductivity type N), and a trench 7. The P-type buried layer 4 is under the trench 7, and the top surface of the P-type buried layer 4 contacts with the bottom surface of the trench 7. The P-type column 5 is located between two adjacent trenches 7. The P+ heavily doped region 6 is disposed above the P-type column 5, and the bottom surface of the P+ heavily doped region 6 contacts the top surface of the P-type column 5. The N-type lightly doped region 8 is located on the side of the trench 7 and on the top surface of the N-type drift region 3. Said trench 7 is filled with metal, and the metal together with the N-type lightly doped region 8 form a schottky junction. The top surface of the N-type lightly doped region 8 is covered with metal that is the same as the metal in the trench 7, and the metal together with the N-type lightly doped region 8 also form a schottky junction. The top surfaces of said metal and the P+ heavily doped region 6 contact the bottom surface of the metalized anode electrode 9. The junction depth of said P-type buried layer 4 is the same as the that of the P-type column 5.

Additionally, the bottom surface of said P-type buried layer 4 and P-type column 5 can contact the top surface of the N+ substrate 2.

Furthermore, the P-type buried layer 4 can be replaced with the thick oxide layer 10.

Some beneficial effects of the present invention are as follow. Compared to the existing super-junction schottky diode, the structure of this invention has a larger forward current, a smaller forward voltage, and a better reverse breakdown characteristic.

DETAILED DESCRIPTION OF THE INVENTION

In the following detailed description, the features of the various exemplary embodiments may be understood in combination with the drawings.

Embodiment 1

Figure 1:
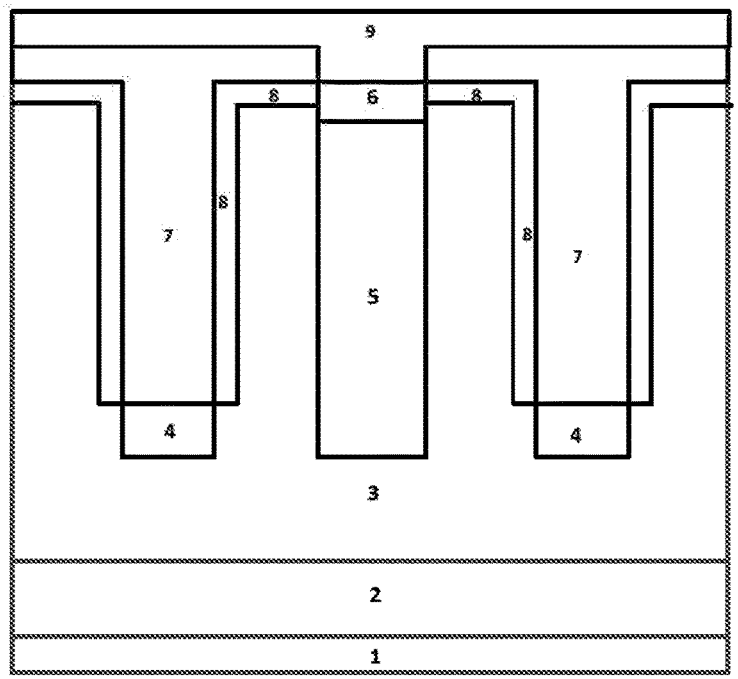
FIG. 1 shows a diagrammatic sectional view of a power device according to the Embodiment 1 of the present invention.

As shown in FIG. 1, the first embodiment of the present invention provides a super-junction schottky diode.

FIG. 1 illustrates a super-junction schottky diode in accordance with the present invention. The super-junction schottky diode includes: a metallized cathode electrode 1, a N+ substrate 2, an N-type drift region 3 and a metalized anode electrode 9. Said N-type drift region 3 includes a P-type buried layer 4, a P-type column 5, a P+ heavily doped region 6, an N-type lightly doped region 8 and a trench 7. The P-type buried layer 4 is under the trench 7, and the top surface of the P-type buried layer 4 contacts with the bottom surface of the trench 7. The P-type column 5 is located between two adjacent trenches 7. The P+ heavily doped region 6 is disposed above the P-type column 5 and the bottom surface of the heavily doped region 6 contacts the top surface of the P-type column 5. The N-type lightly doped region 8 is located on the side of the trench 7 and on the top surface of the N-type drift region 3. Said trench 7 is filled with metal, and the metal together with the N-type lightly doped region 8 form a schottky junction. The top surface of the N-type lightly doped region 8 is covered with metal that is the same as the metal in the trench 7 and the metal together with the N-type lightly doped region 8 also form a schottky junction. The top surfaces of said metal and the P+ heavily doped region 6 contact the bottom surface of the metalized anode electrode 9. The junction depth of said P-type buried layer 4 is the same as the that of the P-type column 5.

The mechanism of the present super-junction schottky diode provided by embodiment 1 will be explained as follows.

During the forward conduction period, the metalized anode electrode 9 is applied with high potential and the metallized cathode electrode 1 is connected to a low potential (e.g., ground). The trench 7 is filled with metal, and the metal trench together with the N-type lightly doped region 8 form a schottky junction. Because the trench 7 is embedded in the body of the device, the trench's sidewall area is large and thus the effective area of the schottky junction is enlarged. Therefore, the current capability of this power diode can be improved. In addition, the forward conduct voltage drop can be decreased to reduce the forward conduction loss by increasing the doping concentration of the N-type drift region 3 since there is a super-junction structure in the N-type drift region 3. The doping concentrations of the N-type lightly doped region 8 and the N-type drift region 3 can be designed independently. As a result, a lower turn-on voltage can be obtained by decreasing the doping concentration of the N-type lightly doped region 8, and a lower forward conduction voltage can be achieved by increasing the doping concentration of the N-type drift region 3.

During the reverse blocking period, the metalized anode electrode 9 is connected to a low potential and the metallized cathode electrode 1 is at a high potential. The P-type column 5 together with the N-type drift region 3 with a relatively high doping concentration can realize a charge compensation and generate a horizontal electric field. This horizontal electric field depletes the N-type drift region 3 and then the electrical characteristic of the N-type drift region 3 is the same as the one of the intrinsic semiconductors in the vertical direction. Therefore, this schottky diode can withstand higher reverse breakdown voltage, and the reverse leakage current is decreased. Additionally, the horizontal electric field will appear between the P-type buried layer 4 and the N-type drift region 3. Therefore, the reverse breakdown voltage is increased and the reverse leakage current can be further reduced. What's more, since the P-type buried layer 4 is located at the bottom of the metal trench 7, the reverse leakage current can be reduced.

In embodiment 1, the structure of the present invention can be produced by the following steps.

Figure 4:
FIG. 4 to FIG. 12 show diagrammatic sectional views of steps for fabricating the device in accordance with the present invention.

Step 1—monocrystalline silicon preparation and epitaxy: The N-type drift region 3 with a certain thickness and doping concentration is deposited on the N-type heavily doped monocrystalline silicon substrate 2 by vapor phase epitaxy (VPE) or other methods, as shown in FIG. 4.

Figure 5:
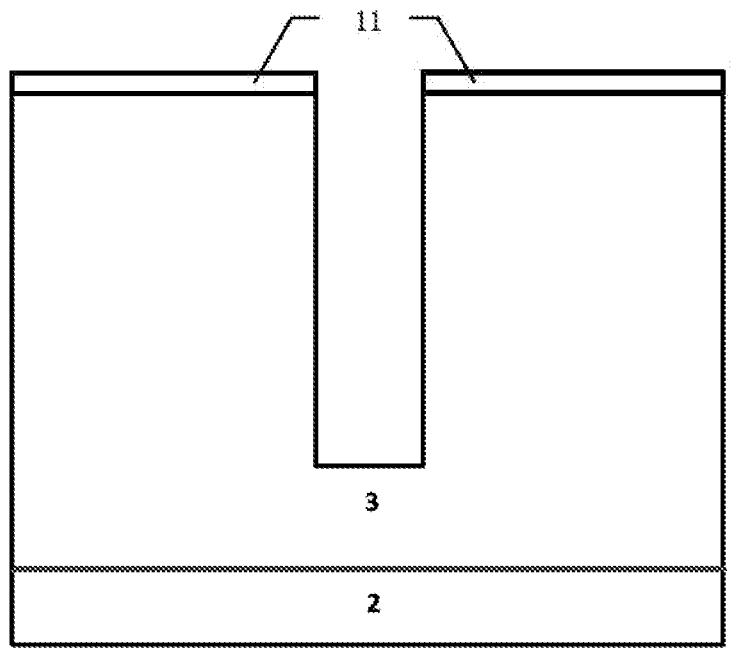

Step 2—etching trench: A hard mask 11 (such as silicon nitride) is deposited on the surface of the silicon wafer as a barrier layer for subsequent etching. Then the hard mask 11 is etched after the lithography and then the deep trench is etched by the shelter of hard mask 11, as shown in FIG. 5. The etching process can be reactive ion etching or plasma etching.

Figure 6:
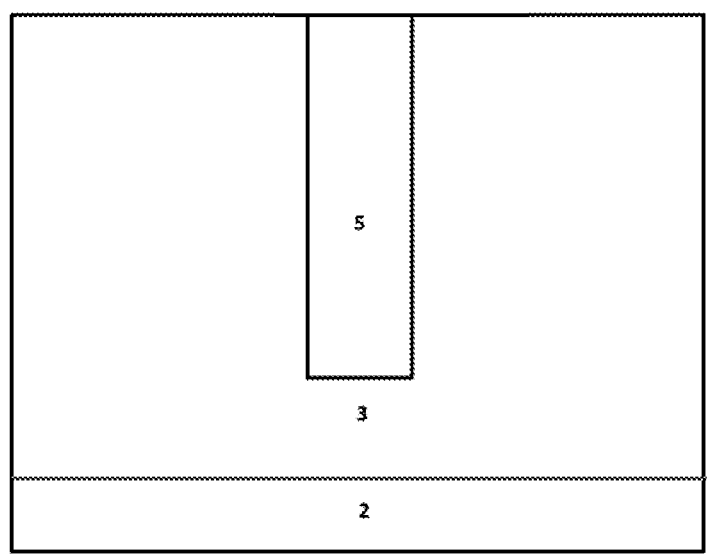

Step 3—P-type column epitaxy: The deep trench is filled with P-type silicon material by an epitaxy process. Subsequently, superfluous P-type silicon on the surface of the wafer is removed by chemico-mechanical polishing (CMP). Thus, the P-type column 5 is formed, as shown in FIG. 6.

Figure 7:
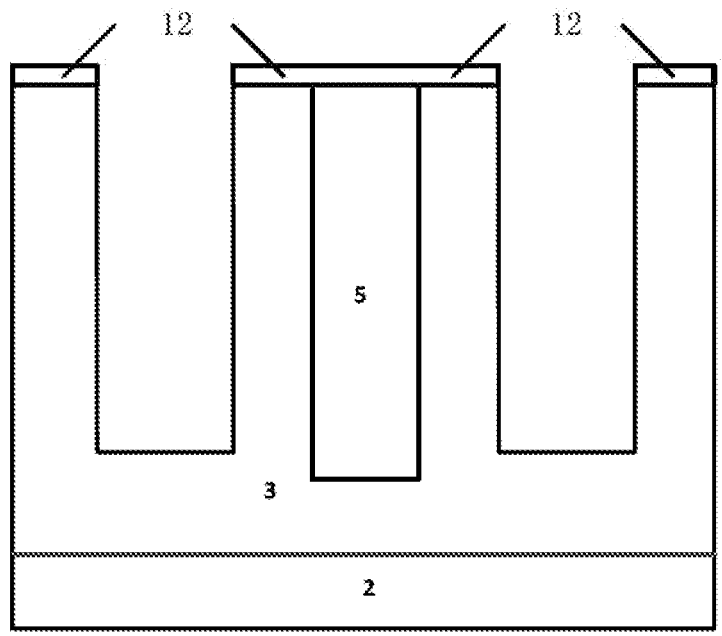

Step 4—etching trench again: Another hard mask 12 (such as silicon nitride) is deposited on the surface of the silicon wafer as a barrier layer for subsequent etching. Then the hard mask 12 is etched after the lithography and then the deep trench is etched by the shelter of hard mask 12, as shown in FIG. 7. The etching process can be reactive ion etching or plasma etching.

Figure 8:
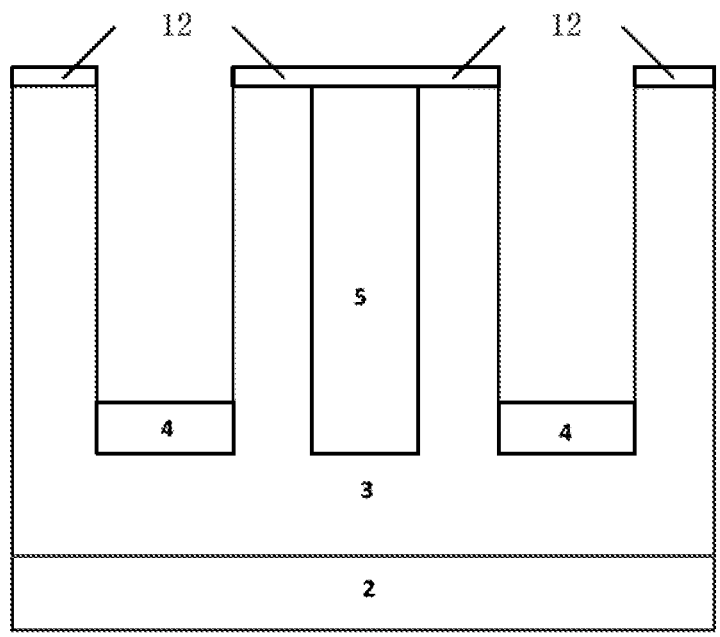

Step 5—implanting ion: As shown in FIG. 8, P-type buried layer 4 is formed on the bottom of the trench by ion implantation with the shelter of hard mask 12.

Figure 9:
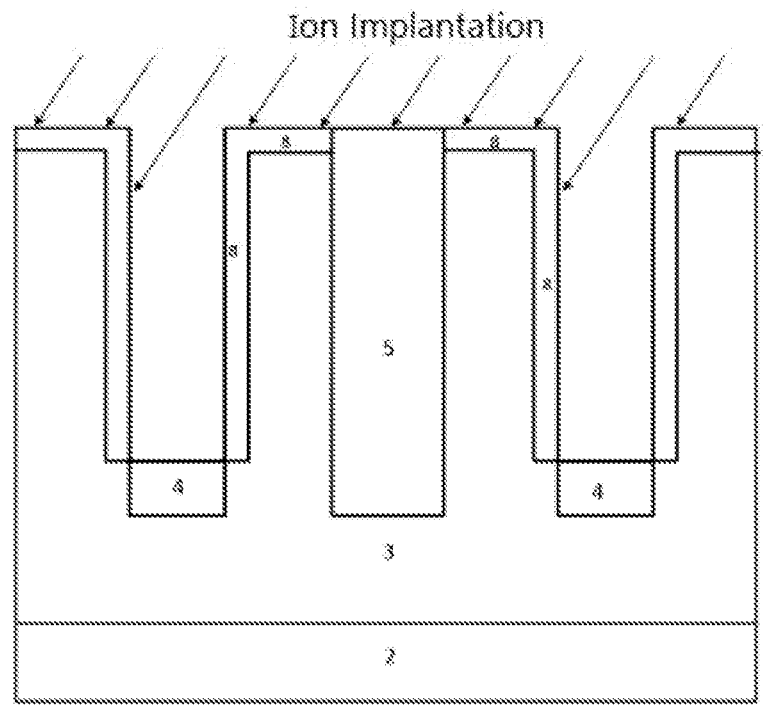

Step 6—implanting ion again: As shown in FIG. 9, the hard mask 12 is removed before the ion implantation. A bevel ion implantation is adapted to implant P-type impurity ions. The N-type lightly doped region 8 is formed by impurity compensation of the implanted P-type impurities with the N-type drift region 3.

Figure 10:
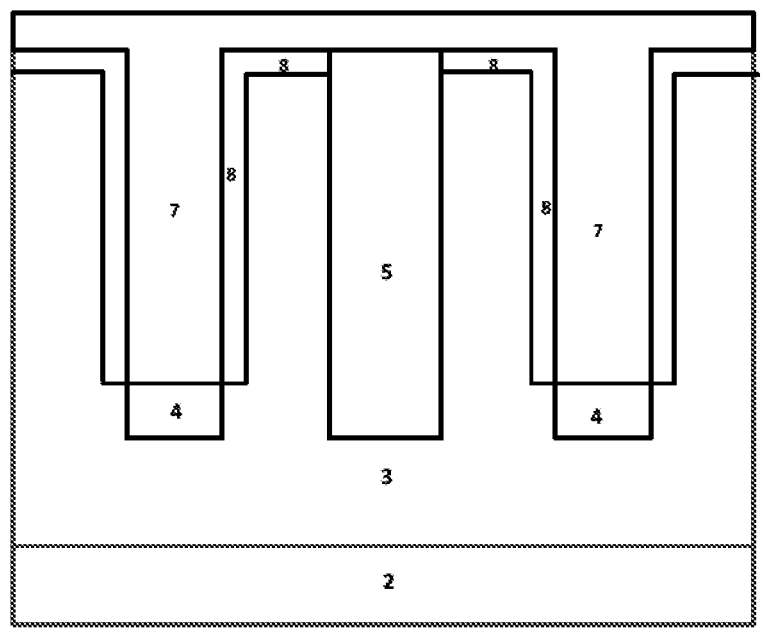

Step 7—filling metal: As shown in FIG. 10, the deep trench is filled with proper schottky metal (such as Platinum). The metal together with the N-type lightly doped region 8 form schottky junction.

Figure 11:
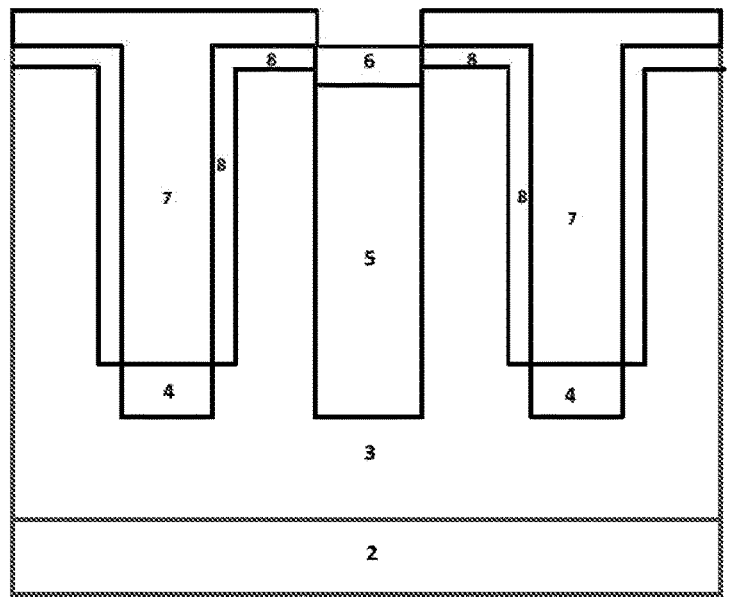

Step 8—etching contact hole: As shown in FIG. 11, the metal above the P-type column 5 is etched to produce a contact hole. The P-type heavily doped region 6 is formed by P-type ion implantation.

Figure 12:
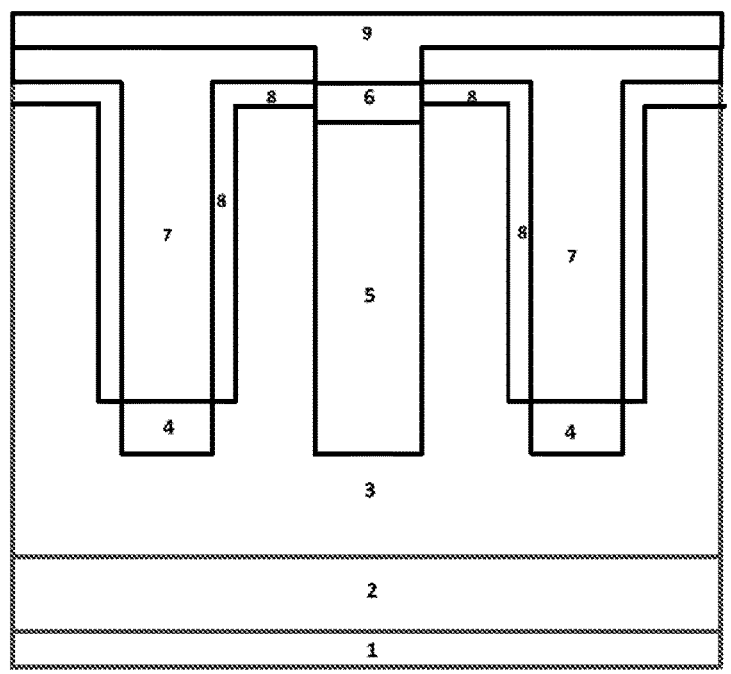

Step 9—depositing metalized electrode: As shown in FIG. 12, metal is deposited. on the top surface of the device to form the anode, electrode 9. The anode electrode 9 is contacted with the metal trench 7 and the P-type heavily doped region 6. Then the back of wafer is thinned and the cathode electrode 1 is produced by metallization.

Embodiment 2

Figure 2:
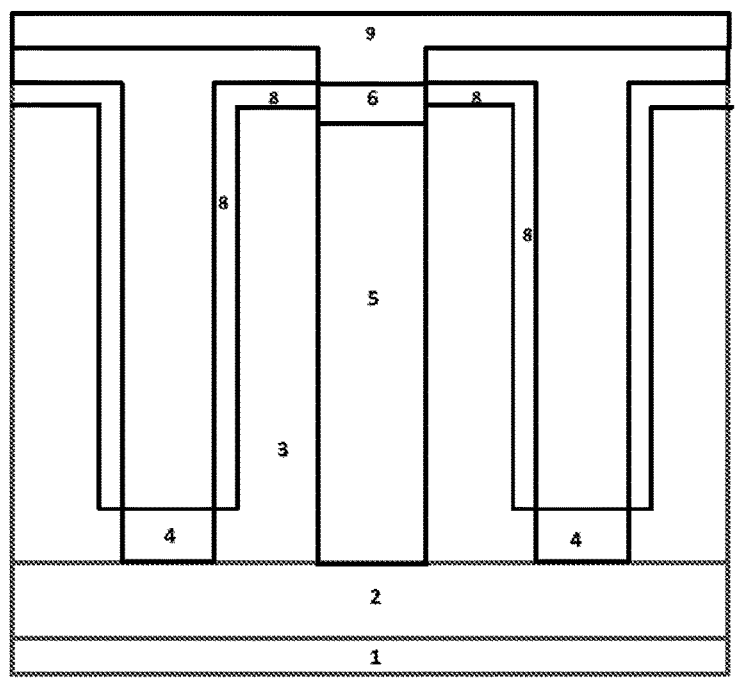
FIG. 2 shows a diagrammatic sectional view of a power device according to the Embodiment 2 of the present invention.

As shown in FIG. 2, based on the embodiment 1, the P-type column 5 and the trench 7 are extended. The bottom surfaces of both P-type column 5 and trench 7 touch the substrate 2. The beneficial effect of this embodiment is that the reverse breakdown voltage and leakage current of the device can be improved further.

Embodiment 3

Figure 3:
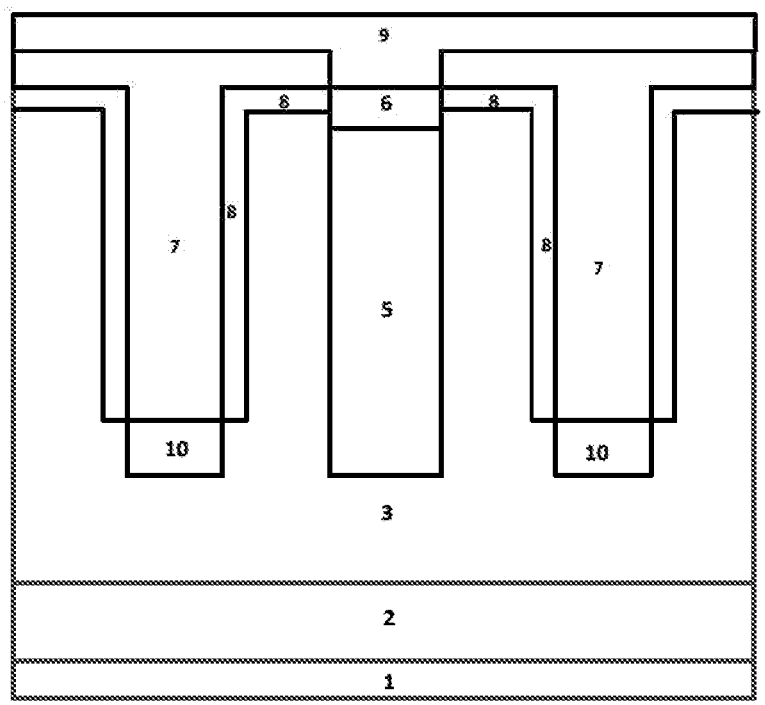
FIG. 3 shows a diagrammatic sectional view of a power device according, to the Embodiment 3 of the present invention.

As shown in FIG. 3, based on the embodiment 1, the P-type buried layer 4 is replaced with the thick oxide layer 10. The breakdown can be prevented to occur at the bottom of the trench 7 and thus the reverse breakdown voltage of the device can be unproved.

In addition, other semiconductor materials such as silicon carbide, gallium arsenide, indium phosphide and germanium silicon can be used to replace silicon in manufacturing.

What is claimed is:
1. A super-junction schottky diode, comprising:
a metalized cathode electrode;
a N+ substrate;
an N-type drift region; and
a metalized anode electrode, wherein said N-type drift region includes a P-type buried layer a P-type column, a P+ heavily doped region an N-type lightly doped region, and a trench, the P-type buried layer is below the trench, and as top surface of the P-type buried layer contacts with a bottom surface of the trench, the P-type column is located between two adjacent trenches, the P+ heavily doped region is located above the P-type column, and a bottom surface of the P+ heavily doped region contacts with a top surface of the P-type column, the N-type lightly doped region is located on a side of the trench and in a top surface of the N-type drift region, said trench is filled with metal, and the metal together with the N-type lightly doped region form a schottky junction, a top surface of the N-type lightly doped region is covered with the metal, and the metal together with the N-type lightly doped region form a schottky junction, a top surface of said metal contacts with a bottom surface of the metalized anode electrode, and the P+ heavily doped region contacts the bottom surface of the metalized anode electrode, and a junction depth of said P-type buried layer is the same as the that of the P-type column.

2. The super-junction schottky diode according to claim 1, wherein the bottom surface of said P-type buried layer and the bottom surface of the P-type column 5 contact with a top surface of the N+ substrate.

3. The super-junction schottky diode according to claim 1, wherein said P-type buried layer below the trench can be replaced with a thick oxide layer.

4. The super-junction schottky diode according to claim 2, wherein said P-type buried layer below the trench can be replaced with a thick oxide layer.

\* \* \* \* \*